United States Patent [19]

Kasimov et al.

[11] Patent Number: 5,557,800
[45] Date of Patent: Sep. 17, 1996

[54] DATA COMPRESSION DEVICE ALLOWING DETECTION OF SIGNALS OF DIVERSE WAVE FORMS

[75] Inventors: Alibek E. O. Kasimov, ulitsa, Mir-Kasimova, 2, kv. 60; Gusein G. O. Gasanov; Levon G. Gevorkov; Evgeny I. Sidorov; Ali A. A. O. Abishev, all of Baku, Azerbaijan

[73] Assignee: Alibek E. O. Kasimov, Baku, Azerbaijan

[21] Appl. No.: 691,046

[22] PCT Filed: Sep. 12, 1989

[86] PCT No.: PCT/SU89/00240

§ 371 Date: Jun. 20, 1991

§ 102(e) Date: Jun. 20, 1991

[87] PCT Pub. No.: WO91/04552

PCT Pub. Date: Apr. 4, 1991

[51] Int. Cl.[6] .................................................. G06F 5/00
[52] U.S. Cl. ................. 395/800; 364/260.6; 364/951.3; 364/224.6; 364/275.7; 364/922.3; 364/413.02; 364/413.03; 382/232; 370/109
[58] Field of Search ..................... 364/413.03; 370/109

[56] References Cited

U.S. PATENT DOCUMENTS

| | | | |
|---|---|---|---|
| 4,034,362 | 7/1977 | Balanca et al. | 341/12 |
| 4,110,564 | 8/1978 | Andresen. | |
| 4,649,482 | 3/1987 | Raviv et al. | 364/413.05 |
| 4,742,458 | 5/1988 | Nathans et al. | 364/413.06 |
| 4,753,246 | 6/1988 | Freeman | 128/731 |
| 4,870,685 | 9/1989 | Kadokawa et al. | 381/31 |
| 4,926,482 | 5/1990 | Frost et al. | 381/31 |
| 5,020,058 | 5/1991 | Holden et al. | 370/109 |
| 5,092,343 | 3/1992 | Spitzer et al. | 128/733 |
| 5,155,741 | 10/1992 | Waters et al. | 375/1 |

FOREIGN PATENT DOCUMENTS 1101832 7/1984 U.S.S.R..

Primary Examiner—Parshotam S. Lall
Assistant Examiner—Kenneth R. Coulter
Attorney, Agent, or Firm—Lilling & Lilling

[57] ABSTRACT

The data compression device allows detection of signals of diverse wave forms and also recording of the time and number of their next appearance. In particular, the Information Compressor includes an analog-to-digital converter with a data processor connected to it. A controller is interconnected to the data processors and also to the analog to digital converter. A signal detector may be interconnected with the data processes and the analog-to-digital converter and it is also preferable for a control console to be provided.

6 Claims, 4 Drawing Sheets

DATA COMPRESSION DEVICE ALLOWING DETECTION OF SIGNALS OF DIVERSE WAVE FORMS

FIELD OF THE INVENTION

This invention relates to information, measurement and computer technology, and more specifically to data compression devices.

BACKGROUND OF THE INVENTION

Currently, many studies of brain heron systems activity employ multineuron activity recording techniques. To this end computers with large memory capacity are based, but even this fails to provide the required efficiency of detecting rapidly varying signals with multiplicity of diverse waveforms.

Known in the art is a data compressor (SU,A,1101832), comprising an analog-to-digital converter with the input thereof constituting the compressor input, a data processor with the data inputs thereof connected to the analog-to-digital converter output via a data bus and with the outputs thereof constituting the compressor outputs, and a controller with the control input thereof interconnected with the control input of the data processor and connected to the control output of the analog-to-digital converter, with the other input thereof connected to another outputs of the data processor, with the control output thereof connected to yet another control input of the data processor and with the address output thereof connected via the address bus to the address input of the data processor.

This known in the art data compressor compares each current sample of the signal to the preceeding sample and therefore, if a sample is repeated, it is recognized as a new signal, i.e. the compressor passes a signal even if it repeats the waveform of the preceeding signal. This significantly reduces compression efficiency when solving problems of detecting interrelations between rapidly varying signals of diverse waveforms, if the number of possible waveforms is rather small.

SUMMARY OF THE INVENTION

It is an object of the present invention to provide an information compressor having such additional units that would allow detection of signals of diverse waveforms, and recording the time and number at their next appearance.

This is achieved by an information compressor, comprising an analog-to-digital converter with the output thereof constituting the compressor input. A data processors have data inputs connected to the output of the analog-to-digital converter via a data bus, the outputs thereof constituting outputs of the compressor. A controller has a control input thereof interconnected with control inputs of the data processors and connected to a control output of the analog-to-digital converter. Another input of the controller is connected to other outputs of the data processor. A control output of the controller is connected to control inputs of the data. An address output of the controller is connected via an address bus to address inputs of the data processor.

It is expedient, that the information compressor further comprise a signal detector with the data inputs thereof interconnected via a data bus with the data inputs of the data processors and connected to the output of the analog-to-digital converter. The control input of the signal detector is interconnected with the control inputs of the data processors and of the controller and connected to the output of the analog-to-digital converter. One of the signal output detectors is connected to another input of the controller, with the other output thereof constituting the output of the information compressor.

It is desirable that the information compressor be further complemented with a control console with two outputs thereof connected, respectively, to two inputs of the signal detector, with another output thereof connected to other inputs of the data processors, of the signal detector and of the controller, and with the last output thereof connected to other inputs of the data processors.

It is suitable, that in the information compressor each data processor includes a comparator with the data inputs and one input thereof constituting, respectively, the data inputs and the input of the data processor. A working memory has address inputs thereof constituting the address inputs of the processor and with the output thereof connected to another input of the comparator and constituting an output of the data processor. A control circuit has two inputs thereof connected to the comparator outputs, with another input thereof connected to an output of the working memory, with another input interconnected with another of its inputs and constituting the control input of the data processor, with two inputs thereof constituting, respectively, the data processor inputs, and with one output thereof connected to another input of the working memory. A read-only memory has an input thereof connected to the other output of the control circuit and with the output thereof constituting another output of the data processor.

It is also expedient, that in the information compressor, the comparator in each data processor comprise a main adder with the data input and another input thereof constituting, respectively, the data input and another input of the comparator. A supplementary adder with one input thereof connected to the output of the main adder and has the output thereof constituting the comparator output. A multiplexer has one input thereof connected to the output of the main adder constituting the comparator output, with another input thereof constituting another comparator input, and with the output thereof connected to another input of the supplementary adder.

It is also suitable, that in the information compressor the control circuit in each data processor comprise a main comparator circuit with the inputs thereof constituting the control circuit inputs. A logic OR gate has one input thereof connected to the main comparator circuit output. A supplementary comparator circuit has the inputs thereof constituting the control circuit inputs and with the output thereof connected to another input of the logic OR gate. A flip-flop has one input thereof connected to the OR gate output, with another input thereof interconnected with another input of the supplementary comparator circuit and with the last input thereof constituting another input of the control circuit. A logic AND gate has one input thereof connected to an output of the flip-flop and the other input thereof constituting the control circuit input, with the output thereof constituting the control circuit output. A logic NOT gate has the input thereof connected to another output of the flip-flop and with the output thereof constituting another output of the control circuit.

It is also desirable, that in the information compressor the signal detector comprise a signal/noise comparator with the data inputs thereof and two other inputs thereof and two other inputs thereof constituting the data inputs and two inputs of the signal detector. A signal end detector has one input thereof interconnected with another input of the signal/noise comparator and constituting another signal detector input, with two other inputs thereof connected, respectively, to signal/noise comparator outputs, with another input thereof consituting yet another input of the signal detector, with one output thereof connected to another input of the signal/noise comparator and constituting one output of the signal detector and with the other output thereof constituting the other output of the signal detector.

It is further expedient, that in the information compressor the signal/noise comparator in the signal detector comprise an adder with the inputs thereof constituting the inputs of the signal/noise comparator. A main flip-flop has one input thereof connected to the adder output and with the other input thereof constituting the input of the signal/noise comparator. A supplementary flip-flop has one input thereof connected to the output of the main flip-flop and constituting the signal/noise comparator output, and with the output thereof constituting the output of the signal/noise comparator.

It is further desirable, that in the information compressor the signal end detector in the signal detector comprise a logic AND gate with two inputs thereof consituting the inputs of the signal end detector. A counter has one input thereof connected to the output of the logic AND gate and with the other input thereof constituting the input of the signal end detector. An adder with one input thereof connected to the counter output and with the other input constituting another input of the signal end detector. A logic AND gate has the input thereof connected to the counter output. A logic NOT gate has the input thereof connected to the output of the logic AND gate and a delay element has the input thereof connected to the output of the logic NOT gate, with the output thereof, along with the output of the NOT gate, constituting, respectively, the outputs of the signal end detector.

It is preferable, that in the information compressor the controller comprise a signal detection circuit with the two inputs thereof constituting the controller inputs. A counter has one input thereof interconnected with another input of the signal detector circuit and connected to the main counter output, and with the output thereof constituting the controller output. A supplementary counter has one input and the output thereof constituting, respectively, the controller input and output and with the other input thereof interconnected with yet another input of the decoder and of the main counter and constituting the controller input.

This invention allows detection of signals of diverse waveforms, and recording as the time and number at their next appearance, thereby improving information compression efficiency.

Furthermore, this invention allows, in particular, entry of "rapid" signals during long time intervals and their immediate unloading onto magnetic disks or tapes.

BRIEF DESCRIPTION OF THE DRAWINGS

Other objectives and advantages of this invention will become apparent from the following detailed description of preferred embodiments thereof with reference to the accompanying drawings, wherein.

PREFERRED EMBODIMENT OF THE INVENTION

Figure 1:
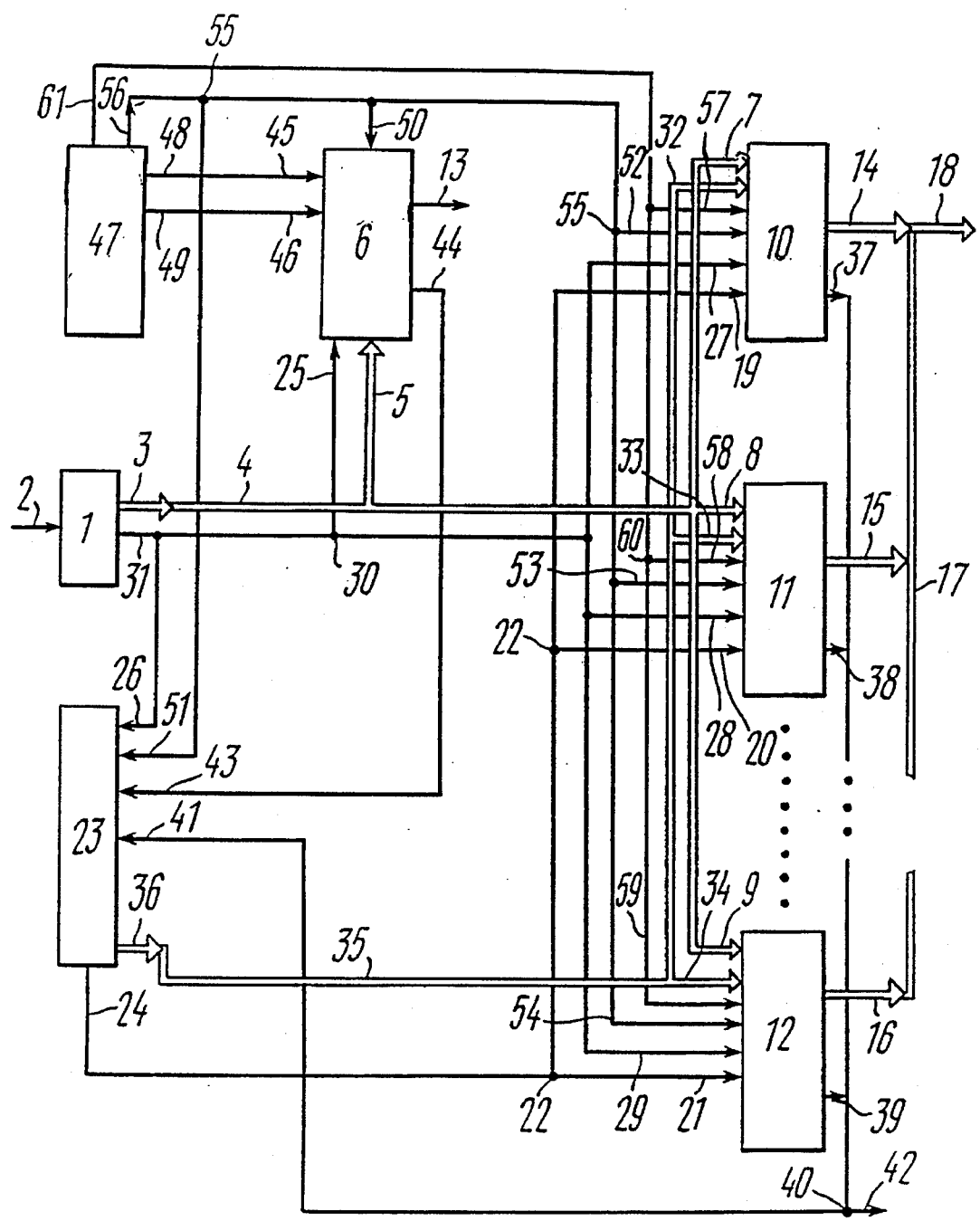
FIG. 1 shows the block diagram of the information compressor of this invention.

The information compressor comprises an analog-to-digital converter 1 (FIG. 1) with input 2 thereof constituting the compressor input and with output 3 thereof connected via data bus 4 to data input 5 of signal detector 6, and to data inputs 7, 8, 9 of, respectively, data processors 10, 11, 12. Output 13 of signal detector 6 constitutes the compressor output. Outputs 14, 15, 16 of data processors 10, 11, 12, respectively, are interconnected via bus 17 and constitute compressor output 18. Control inputs 19, 20, 21 of data processors 10, 11, 12, respectively, are interconnected in common point 22 and connected to output 24 of controller 23. Control inputs 25, 26 of signal detector 6 and controller 23, respectively, and the other control inputs 27, 28, 29 of data processors 10, 11, 12, respectively, are interconnected into common point 30 and connected to output 31 of analog-to-digital converter 1. Address inputs 32, 33, 34 of data processors 10, 11, 12, respectively, are connected to address output 36 of controller 23 via address bus 35. Outputs 37, 38, 39 of data processors 10, 11, 12, respectively, are interconnected into common point 40 and connected to input 41 of controller 23 and constitute output 42 of the information compressor. Input 43 of controller 23 is connected to another output 44 of signal detector 6. Two inputs 45, 46 of the signal detector 6 are connected to inputs 48, 49, respectively, of control console 47. Inputs 50, 51 of signal detector 6 and of controller 23, respectively, and inputs 52, 53, 54 of data processors 10, 11, 12, respectively, are interconnected into common point 55 and connected to output 56 of console 47. Inputs 57, 58, 59 of data processors 10, 11, 12, respectively are interconnected into common point 60 and connected to output 61 of console 47.

Data processors 10, 11, 12 are identical and therefore their block diagrams will be described on the example of data processor 10.

Data processor 10 comprises comparator 62 (FIG. 2) with input 63 thereof connected to the output of working memory 64, this output constituting output 14 of data processor 10 (FIG. 1). Data inputs 65, 66 (FIG. 2) of comparator 62 and working memory 64, respectively, are interconnected to constitute input 7 of data processor 10. Outputs 67, 68 of comparator 62 drive inputs 70, 71 of control circuit 69, respectively, another input 72 whereof is connected to the other output 23 of memory 64 and another input 74 whereof is interconnected with another input 75 of memory 64 at common point 76 to constitute control input 27 of data processor 10 (FIG. 1). Output 77 of control circuit 69 is connected to another input 78 of memory 64, with the other output 79 of control circuit 69 connected to input 81 of read-only memory 80, the output whereof constitutes output 37 of data processor 10 (FIG. 1).

Comparator 62 (FIG. 2) comprises main adder 82 (FIG. 3) with output 83 thereof connected to input 85 of supplementary adder 84, the other input 86 whereof is connected to output 88 of multiplexer 87. The other output of adder 82 constitutes output 68 of comparator 62 (FIG. 2) and is connected to input 89 (FIG. 3) of multiplexer 87.

Figure 2:
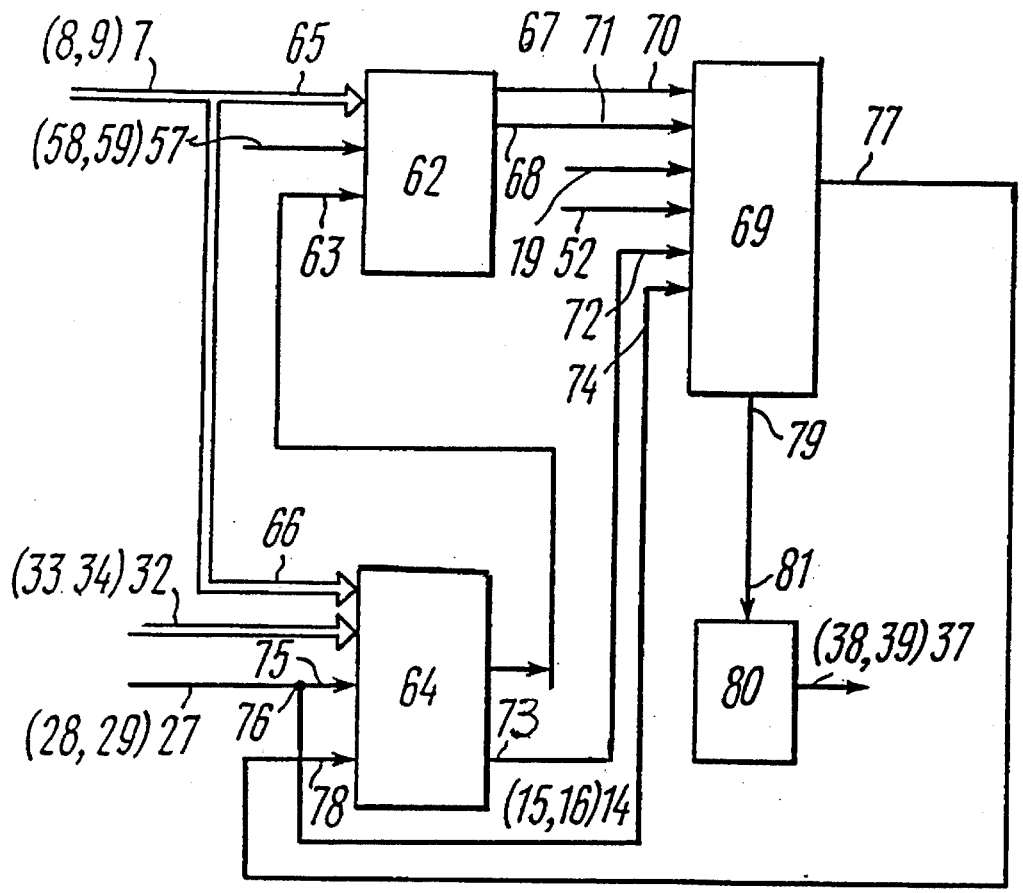
FIG. 2 shows the block diagram of the data processor according to the invention.
Figure 3:
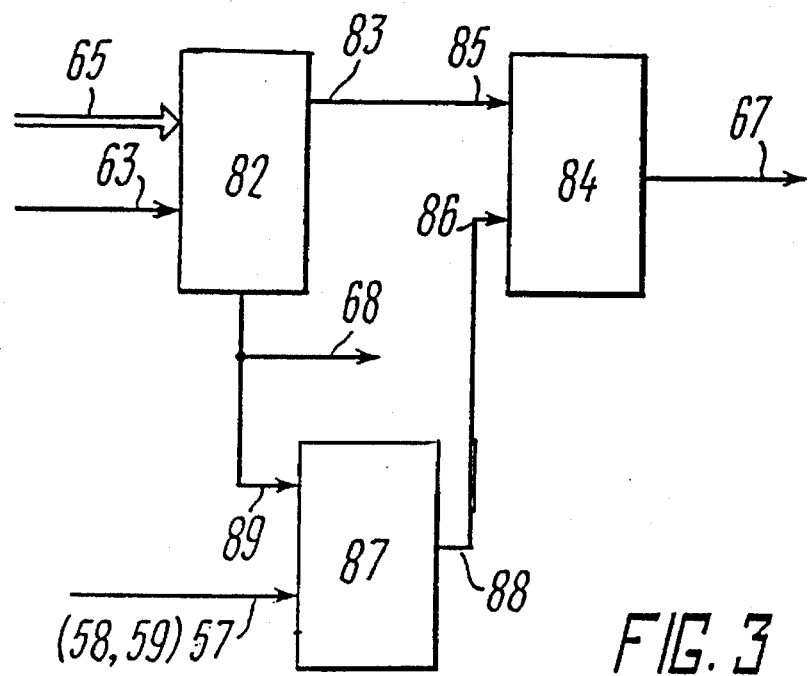
FIG. 3 shows the block diagram of the comparator, according to the invention.

Control circuit 69 (FIG. 2) of data processor 10 (11, 12) (FIG. 1) comprises main comparator circuit 89 (FIG. 4) with output 90 thereof connected to input 92 of logic OR gate 91, the other input 93 whereof is connected to output 95 of supplementary comparator circuit 94 and the output 96 whereof connected to input 98 of flip-flop 97. The other inputs 99, 100 of flip-flop 97 and of supplementary comparator circuit 94, respectively, are interconnected at common point 101 and constitute input 74 of control circuit 69 (FIG. 2). Outputs 102 and 103 (FIG. 4) of flip-flop 97 drive input 105 of NOT gate 104 and input 107 of AND gate 106, respectively.

Signal detector 6 (FIG. 1) comprises signal/noise comparator 108 (FIG. 5) with outputs 109, 110 thereof connected to inputs 112, 113, respectively, of signal end detector 111. Inputs 114, 115 of comparator 108 and detector 111, respectively, are interconnected at common point 116 and constitute input 25 of signal detector 6 (FIG. 1). One output of signal end detector 111 (FIG. 5) constitutes output 44 of signal detector 6 (FIG. 1) and is connected to input 117 of signal/noise comparator 108 (FIG. 5).

Figure 5:
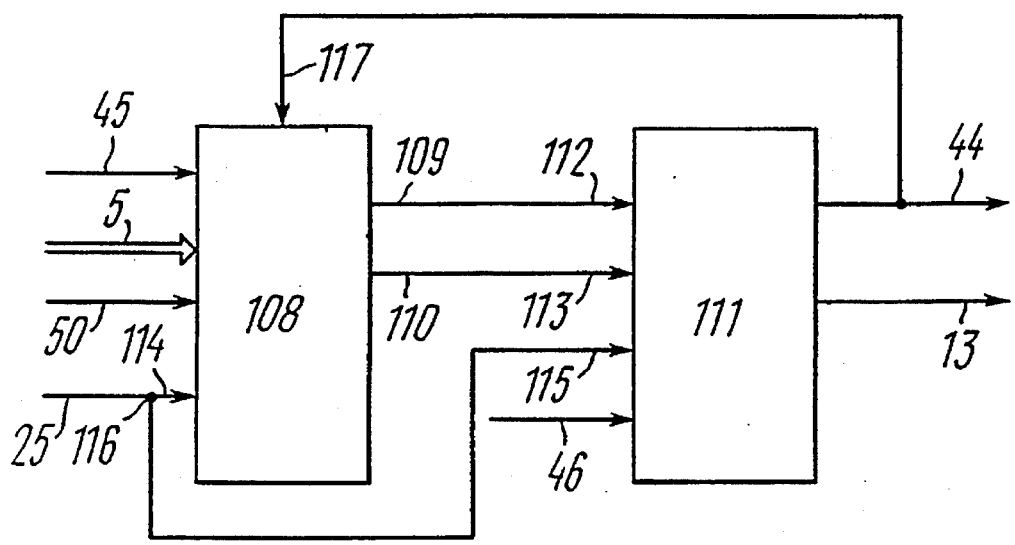
FIG. 5 shows the block diagram of the signal detector, according to the invention.
Figure 6:
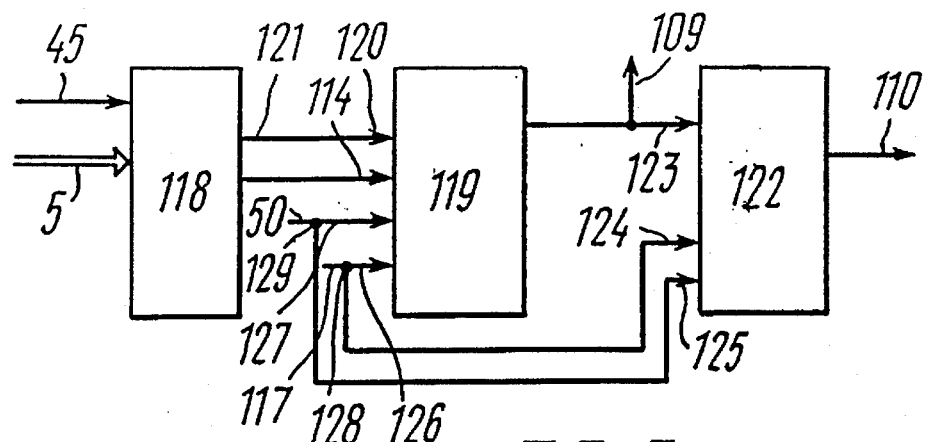
FIG. 6 shows the block diagram of the signal/noise comparator, according to the invention.

Signal/noise comparator 108 comprises adder 118 (FIG. 6) with the inputs thereof constituting inputs 5 and 45 of comparator 108 (FIG. 5), main flip-flop 119 (FIG. 6) with input 120 thereof connected to output 121 of adder 118 and with the other input thereof constituting input 114 of comparator 108 (FIG. 5). The output of flip-flop 119 (FIG. 6) constitutes output 109 of comparator 108 (FIG. 5) and is connected to input 123 of supplementary flip-flop 122, the other inputs 124 and 125 whereof are interconnected with inputs 126 and 127 of flip-flop 119, respectively, at common points 128 and 129, respectively, to constitute inputs 50 and 117, respectively, of signal/noise comparator 108 (FIG. 5). The output of flip-flop 122 (FIG. 6) constitutes output 110 of signal/noise comparator 108 (FIG. 5).

Figure 7:
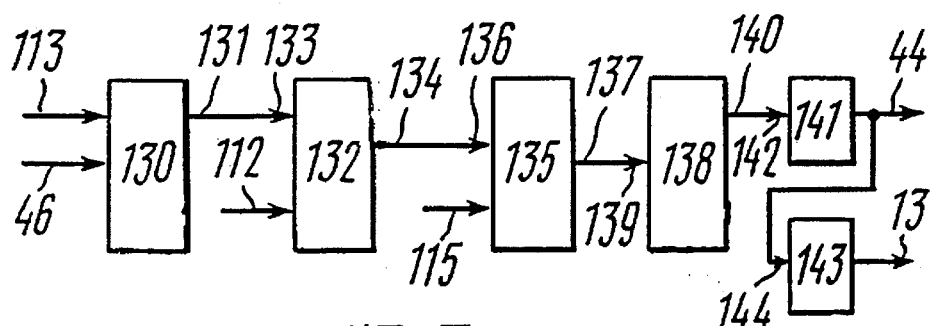
FIG. 7 shows the block diagram of the signal end detector, according to the invention.

Signal end detector 111 comprises logic AND gate 130 (FIG. 7) with two inputs thereof consituting inputs 113, 46 of detector 111 (FIG. 5) and with output 131 thereof connected to input 133 of counter 132, the other input whereof constitutes input 112 of signal end detector 111 (FIG. 5). Output 134 (FIG. 7) of counter 132 is connected to input 136 of adder 135, the other input whereof constitutes input 115 of signal end detector 111 (FIG. 5). Output 137 of adder 135 is connected to input 139 of logic AND gate 138 with the output 140 thereof connected to input 142 of NOT gate 141, the output whereof constitutes output 44 of signal end detector 111 (FIG. 5) and drives input 144 of delay element 143 (FIG. 7), the output whereof constitutes output 13 of signal end detector 111 (FIG. 5).

Figure 8:
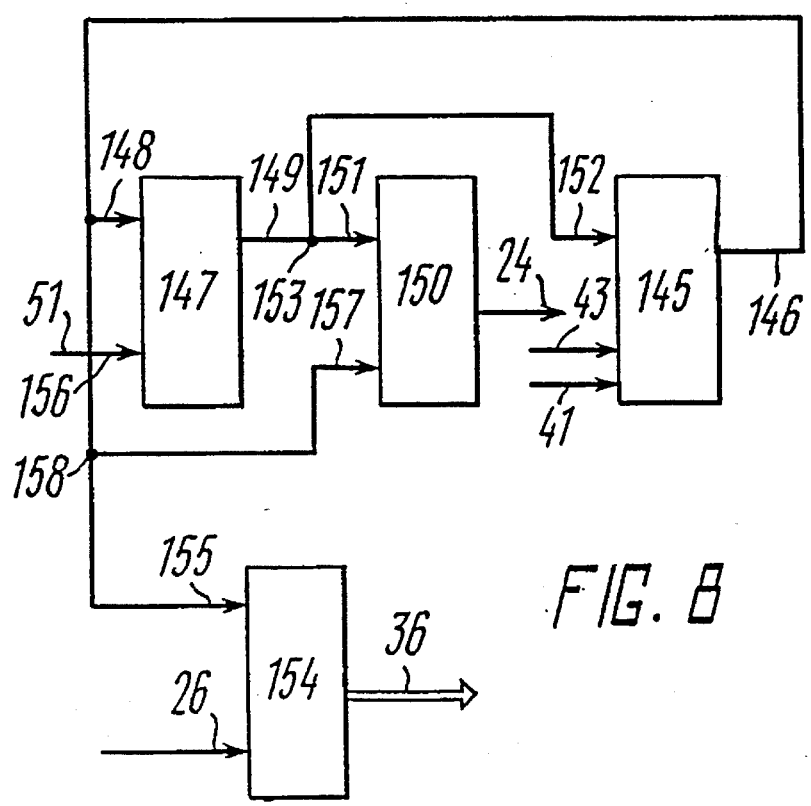
FIG. 8 shows the block diagram of the controller, according to the invention.

Controller 23 (FIG. 1) comprises signal detection circuit 145 (FIG. 8) with the two inputs thereof constituting inputs 41 and 43 of controller 23 (FIG. 1). Output 146 of signal detection circuit 145 drives input 148 of main counter 147, the output 149 whereof is connected to input 151 of decoder 150 and is interconnected with input 152 of detection circuit 145 in common point 153. The output of decoder 150 is output 24 of controller 23 (FIG. 1). Controller 23 further comprises supplementary counter 154 (FIG. 8) with input 155 thereof interconnected to other inputs 156 and 157 of counter 147 and decoder 150, respectively, in common point 158 to constitute input 51 of controller 23 (FIG. 1). The other input and the output of counter 154 (FIG. 8) constitute, respectively, input 26 and output 36 of controller 23.

The information compressor functions as follows.

A reset pulse from output 56 (FIG. 1) of control console 47 arrives at input 50 of signal detector 6 and at inputs 52, 53, 54 of data processors 10, 11, 12, respectively. Thereafter, the noise level code, the signal end code and the aperture code are set on console 47 and are transmitted from outputs 48 and 49 to inputs 45 and 46, respectively, of signal detector 6 and from output 61 to inputs 57, 58, 59 of data processors 10, 11, 12, respectively. An analog outside signal is applied to input 2 of analog-to-digital converter 1, wherein it is digitized and passed from output 3 via data bus 4 to data input 5 of signal detector 6 and to data inputs 7, 8, 9 of data processors 10, 11, 12, respectively. Simultaneously with data from converter 1 a "conversion completed" signal from output 31 is passed to input 25 of signal detector 6, to inputs 27, 28, 29 of data processors 10, 11, 12, respectively, and to input 26 of controller 23. Thereafter signal detector 6 compares the noise level code to the data code, and, if the data signal is within the noise level band, a logic "0" is generated at output 44 of signal detector 6, passed to input 43 of controller 23 and inhibits the controller. If the data signal is above noise level, a logic "1" is generated at output 44 of signal detector 6, passed to input 43 of controller 23 and enables controller 23.

The address code of the signal from converter 1 is set on address bus 35 by output 36 of controller 23 and passed to inputs 32, 33, 34 of data processors 10, 11, 12, respectively. Simultaneously with the address code, controller 23 sets the control code at its output 24, passed to inputs 19, 20, 21 of data processors 10, 11, 12, respectively, wherein data from output 3 of converter 1 is read out at a transition from "0" to "1" or written at a transition from "1" to "0". On the next arrival of data from output 3 of converter 1 at inputs 7, 8, 9 of data processors 10, 11, 12 a "0" to "1" transition causes simultaneous readout and comparison of the data in all data processors 10, 11, 12.

If the received data differs from data previously written by more than the aperture set, it is entered into data processor 10 and thereafter this process is continued. In case the signal from the analog-to-digital converter differs from that written into data processors 10, 11, 12 by less than the set aperture, at output 37, or 38, or 39 a number will be generated, indicating the data processor 10, or 11, 12, wherein signals identical to that just received are stored. Simultaneously the number code from output 37 (or 38, or 39) is sent to input 41 of controller 23, where the time of repeated signal appearance is recorded. This process is repeated until the memory of data processors 10, 11, 12 is filled. Thereafter the signals entered are serially read out from outputs 14, 15 and 16 of data processors 10, 11, 12.

Data processor 10 (or 11, or 12) functions as follows.

Input 52 (FIG. 2) of control circuit 69 receives a reset pulse from control console 47, input 57 of comparator 62 receives the aperture code from control console 47, input 65 of comparator 62 and input 66 of working memory 64 receive data from analog-to-digital converter 1, and input 63 of comparator 62 receives a signals from output 14 of working memory 64. In comparator 62 the data from analog-to-digital converter 1 is compared to the signal received from working memory 64 and the difference between these signals is compared to the aperture code. If the set aperture is greater or less than this difference, different logic levels are generated at outputs 67, 68 of comparator 62 and control circuit 69 generates an enable signal at its output 77, passed to input 78 of working memory 64. Simultaneously, the address code of the received signal arrives at input 32 of working memory 64 and control signals arriving from controller 23 at input 19 of control circuit 69 and from analog-to-digital converter 1 at input 75 of working memory 64 and at input 74 of control circuit 69 enter the received data into working memory 64.

If the aperture is equal to the difference between the data received from analog-to-digital converter 1 and the signal from working memory 64, two identical logic signals are generated at outputs 67, 68 of comparator circuit 62, thereby causing an enable signal to be sent from output 79 of control circuit 69 to input 81 of read-only memory 80, which generates a signal number code at its output 37. A signal inhibiting data writing into working memory 64 arrives from output 77 of control circuit 69. Thereafter the process is repeated.

Comparator 62 in data processor 10 (or 11, or 12) functions as follows.

Input 65 (FIG. 3) of adder 82 receives data from analog-to-digital converter 1 to be compared with the code signal at its input 63. The difference from output 83 of adder 82 is passed to input 85 of adder 84, wherein a logic signal is generated at output 68 to be applied to input 89 of multiplexer 87, the other input 57 whereof receives the aperture code from control console 47. Depending on the signal at input 89, multiplexer 87 sets the aperture in the direct or inverse code and passes this signal to input 86 of adder 84, to generate a difference signal at its output 67.

Control circuit 69 (FIG. 2) in data processor 10 (or 11, or 12) functions as follows.

Figure 4:
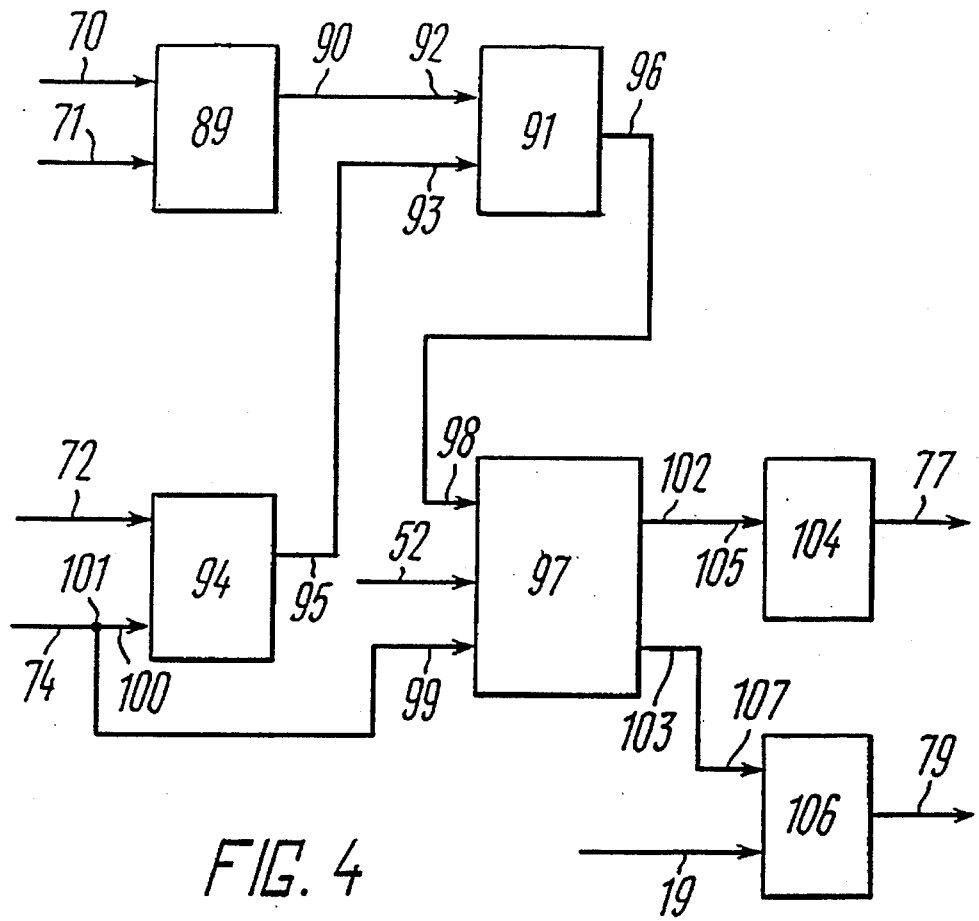
FIG. 4 shows the block diagram of the control circuit, according to the invention.

Inputs 70 and 71 (FIG. 4) of comparator element 89 receive the signal from adder 84 (FIG. 3) in comparator 62 (FIG. 2). Comparator element 89 (FIG. 4) generates a logic "0" at its output 90 if the signals are equal, passed to input 92 of OR gate 91, input 93 whereof simultaneously receives a signal from output 95 of comparator element 94 with input 72 thereof receiving a signal from working memory 64 (FIG. 2) and other input 100 thereof receiving a control pulse from controller 23 (FIG. 1). One of the signals arriving at inputs 92, 93 of OR gates 91 (FIG. 4) is passed from its output 96 to input 98 of flip-flop 97, the other input 52 whereof receives a reset pulse from control console 47 (FIG. 1) to reset flip-flop 97 (FIG. 4). The signal from output 102 of flip-flop 97 is passed to input 105 of NOT gate 104 and after inverstion is passed from its output 77 to input 78 of working memory 64 (FIG. 2). The signal from the other output 103 (FIG. 4) of flip-flop 97 arrives at input 107 of logic AND gate 106, input 19 whereof receives a control signal from controller 23 (FIG. 1) and in case of a logic "1" at input 107 the control signal from its output 79 is again applied to output 13 of signal detector 6 (to the compressor input).

Signal detector 6 functions as follows.

Input 50 of signal/noise comparator 108 (FIG. 5) receives a reset pulse to reset comparator 108. Input 5 of signal/noise comparator then receives data and input 45 thereof receives the noise code for comparison, the result being gated by synchronization pulses at input 114 to generate a reset signal at output 110 passed therefrom to input 113 of signal end detector 111 to reset the signal and detector. An enable signal is passed from output 109 of signal/noise comparator 108 to input 112 of signal end detector 111 to remove the inhibit from input 113 thereof and thus pass gating pulses to signal end detector 111. Input 115 of signal end detector 111 receives the signal end code from control console 47 (FIG. 1). After comparing the time of signal end to the gating synchronization pulse, a control signal is generated at output 44 of signal end detector 111 (FIG. 5) passed to controller 23 (FIG. 1) and to input 117 of signal/noise comparator 108 (FIG. 5). This signal sets signal/noise comparator 108. The signal generated at output 13 of signal end detector 111 is passed to the compressor output.

Signal/noise comparator 108 (FIG. 5) functions as follows.

A reset pulse arrives at input 50 of flip-flop 119 (FIG. 6) and at input 125 of flip-flop 122.

Input 45 of adder 118 receives the noise level code and input 5 of adder 118 receives data, for comparison in signal/noise comparator 108. If the data level is below that of noise, a logic "1" is set at output 121 of adder 118, inhibiting passage of synchronization pulses arriving at input 25 of flip-flop 119 and the latter remains in its initial state.

If the data level is above that of noise, a logic "0" is set at output 121 of adder 118, enabling passage of synchronization pulses arriving at input 114 of flip-flop 119 and switching it to the logic "1" state, i.e. setting a logic "1" at flip-flop 119, output 109 to be passed to input 123 of flip-flop 122 and simultaneously to output 109 of signal/noise comparator 108, setting a logic "1" at output 110 of flip-flop 122.

Signal end detector 111 functions as follows.

An enable signal from signal/noise comparator 108 arrives at input 113 of logic AND gate 130 (FIG. 7), along with a synchronization pulse at its input 46. If the enable signal is a logic "1", synchronization pulses are passed to output 131 of AND gate 130 and arrive at input 133 of counter 132. At the same time input 112 of counter 132 receives an enabling signal and the time code arriving at input 136 of adder 135 is set at output 134 of counter 132, with the signal end being set by a signal from control console 47 (FIG. 1) arriving at adder 135 input 136. The result of comparison is passed from output 137 of adder 135 (FIG. 7) to input 139 of logic AND gate 138 and from the output 140 thereof to input 142 of logic NOT gate 141, the inversed signal from the output whereof arrives at input 144 of delay element 143 and simultaneously is the output 13 of signal/noise comparator 108 (and also the output 13 of the information compressor). A set signal is generated at output 44 of delay element 143 and is passed to set input 117 (FIG. 5) of signal/noise comparator 108, setting this latter to its initial state.

Controller 23 (FIG. 1) functions as follows.

A reset pulse is applied to input 156 of main counter 147 (FIG. 8), to decoder 150 input 157, and to supplementary counter 154 input 155, setting them to their initial states. Input 26 of counter 154 receives synchronization pulses to set the address code at its output 36, passed to address inputs 32, 33, 34 of data processors 10, 11, 12, respectively. The signal number code from outputs 37, 38, 39 of data processors 10, 11, 12, respectively, arrives at input 41 of signal detection circuit 145 (FIG. 8), and input 43 receives a control pulse from signal detector 6. A code signal from output 149 of counter 147 arrives at input 152 of signal detection circuit 145 and is compared to the channel number code. In case of coincidence a control pulse is generated at output 146 of detection circuit 145 and is passed to input 148 of counter 147, to change the code signal at output 149 thereof. This signal arrives at input 151 of decoder 150 to generate a control signal at output 24 thereof, passed to control inputs 19, 20, 21 of data processors 10, 11, 12, respectively. In case the code at input 152 of signal detection circuit 145 differs from the channel number code, the control signal from output 146 of signal detection circuit 145 is not passed.

This invention provides independence of the data compression ratio from the rate of input signal variation, thus allowing passage to the output at low speed of rapidly varying signals, such as spikes, during studies of brain multineuron activity.

Industrial Applicability

The invention can be used for data compression in multichannel telemetry systems with time-division multiplexing.

Moreover, the invention provides reception of analogue electric biplar signals, their digitization, classification and transfer to a computer via a communications channel.

This invention is also intended to enter multineuron activity signals to a computer and can be used in any information transmission system to interface high infromation-content sources with the input channel of a computer.

We claim:

1. An information compressor, comprising:

an analog-to-digital converter with an input constituting the input of said compressor, a data output, and a control output;

multiple data processors with first data inputs, address inputs, first control inputs, second control inputs, and first and second outputs; with the first data inputs connected to said data output of said analog-to-digital converter, first control inputs connected to said control output of said analog-to-digital converter, and first and second outputs constituting first and second outputs of the compressor; and a controller with a control input, a first input, an output, and an address output; with the control input connected to said control output of said analog-to-digital converter, the first input connected to said second outputs of said data processors, the output connected to said second control inputs of said data processors, and the address output connected to said address inputs of said data processors;

wherein each data processor comprises:

an individual working memory;

a comparator with the following elements, inputs, and outputs: a data input and a first input which constitute said data input and said second input of said data processor, a second input, and outputs, wherein said comparator comprises a first adder having first and second inputs constituting said data input and said second input of said comparator, a first output, and a second output constituting one of said outputs of said comparator; a second adder having a first input connected to said first output of said first adder, a second input, and an output constituting one of said outputs of said comparator; and a multiplexer having a first input connected to said second output of said first adder, a second input constituting said first input of said comparator and an output connected to said second input of said second adder;

said working memory having a data input, an address input, a first input, a second input, a first output, and a second output; with said first input constituting said data input, said address input, and said first control input of said data processor, said first output constituting said first output of said data processor and connected to said second input of said comparator;

a control circuit with the following inputs and outputs: first and second inputs connected to said outputs of said comparator, third and fourth inputs constituting said second control input and said first input of said data processor, a fifth input connected to said second output of said working memory, a sixth input constituting said first control input of said data processor, a first output connected to said second input of said working memory, and an output; and a read only memory having an input connected to said first output of said control circuit and an output constituting said second output of said data processor.

2. An information compressor, comprising:

an analog-to-digital converter with an input constituting the input of said compressor, a data output, and a control output;

multiple data processors with first data inputs, address inputs, first control inputs, second control inputs, and first and second outputs; with the first data inputs connected to said data output of said analog-to-digital converter, first control inputs connected to said control output of said analog-to-digital converter, and first and second outputs constituting first and second outputs of the compressor; and a controller with a control input, a first input, an output, and an address output; with the control input connected to said control output of said analog-to-digital converter, the first input connected to said second outputs of said data processors, the output connected to said second control inputs of said data processors, and the address output connected to said address inputs of said data processors;

wherein each data processor comprises:

an individual working memory;

a comparator with the following elements, inputs, and outputs: a data input and a first input which constitute said data input and said second input of said data processor, a second input, and outputs, wherein said comparator comprises a first adder having first and second inputs constituting said data input and said second input of said comparator, a first output, and a second output constituting one of said outputs of said comparator; a second adder having a first input connected to said first output of said first adder, a second input, and an output constituting one of said outputs of said comparator; and a multiplexer having a first input connected to said second output of said first adder, a second input constituting said first input of said comparator and an output connected to said second input of said second adder;

said working memory having a data input, an address input, a first input, a second input, a first output, and a second output; with said first input constituting said data input, said address input, and said first control input of said data processor, said first output constituting said first output of said data processor and connected to said second input of said comparator;

a control circuit with the following elements, inputs, and outputs: first and second inputs connected to said outputs of said comparator, third and fourth inputs constituting said second control input and said first input of said data processor, a fifth input connected to said second output of said working memory, a sixth input constituting said first control input of said data processor, a first output connected to said second input of said working memory, wherein said control circuit comprises a first comparator having first and second inputs constituting said first and second inputs of said control circuit, and an output; an OR gate having a first input connected to said output of said first comparator circuit, a second input and an output; a second comparator circuit having first and second inputs constituting said fifth and sixth inputs of said control circuit, and an output connected to said second input of said OR gate; a flip-flop having a first input connected to said output of said OR gate, second and third inputs constituting said fourth and sixth inputs of said control circuit, and first and second outputs; a NOT gate having an input connected to said first output of said flip-flop and an output constituting said first output of said control circuit; and an AND gate having a first input connected to said second output of said flip-flop, a second input constituting said third input of said control circuit, and an output constituting said second output of said control circuit; and a read only memory having an input connected to said first output of said control circuit and an output constituting said second output of said data processor.

3. An information compressor, comprising:

an analog-to-digital converter with an input constituting the input of said compressor, a data output, and a control output;

multiple data processors with first data inputs, address inputs, first control inputs, second control inputs, and first and second outputs; with the first data inputs connected to said data output of said analog-to-digital converter, first control inputs connected to said control output of said analog-to-digital converter, and first and second outputs constituting first and second outputs of the compressor;

a controller with a control input, a first input, an output, and an address output; with the control input connected to said control output of said analog-to-digital converter, the first input connected to said second outputs of said data processors, the output connected to said second control inputs of said data processors, and the address output connected to said address inputs of said data processors; and, a signal detector with the following elements, inputs, and outputs: a control input connected to said control output of said analog-to-digital converter, a data input connected to said data output of said analog-to-digital converter, a first output constituting an output of said compressor, and a second output connected to said second input of said controller, wherein said signal detector comprises a signal noise comparator having a data input, a control input and first and second inputs constituting said data input, said control input and said first and third inputs of said signal detector, a third input and first and second outputs; and an end detector having first and second inputs connected to said first and second outputs of said signal noise comparator, third and fourth inputs constituting said control input and said second input of said signal detector, a first output connected to said third input of said signal noise comparator and constituting said second output of said signal detector and a second output constituting said first output of said signal detector.

4. An information compressor according to claim 3, wherein the signal noise comparator in said signal detector comprises an adder having a data input and an input constituting said data input and said first input of said signal noise comparator, and first and second outputs;

a first flip-flop having first and second inputs connected to said first and second outputs of said adder, third and fourth inputs constituting said second and third inputs of said signal noise comparator, and an output constituting said first output of said signal noise comparator; and a second flip-flop having a first input connected to said output of said second flip-flop, second and third inputs constituting said first and third inputs of said signal noise comparator, and an output constituting said second output of said signal noise comparator.

5. An information compressor according to claim 3, wherein said end detector in said signal detector comprises a first AND gate having first and second inputs constituting said second and fourth inputs of said end detector, and an output;

a counter having a first input connected to said output of said AND gate, a second input constituting said first input of said end detector, and an output;

an adder having a first input connected to said output of said counter, a second input constituting said third input of said end detector, and an output;

a second AND gate having an input connected to said output of said adder and an output;

a NOT gate having an input connected to said output of said second AND gate, and an output constituting said first output of said end detector; and a delay element having an input connected to said output of said NOT gate, and an output constituting said second output of said end detector.

6. An information compressor, comprising:

an analog-to-digital converter with an input constituting the input of said compressor, a data output, and a control output;

multiple data processors with first data inputs, address inputs, first control inputs, second control inputs, and first and second outputs; with the first data inputs connected to said data output of said analog-to-digital converter, first control inputs connected to said control output of said analog-to-digital converter, and first and second outputs constituting first and second outputs of the compressor; and a controller with the following elements, inputs, and outputs: a control input connected to said control output of said analog-to-digital converter, a first input connected to said second outputs of said data processors, an output connected to said second control inputs of said data processors, and an address output connected to said address inputs of said data processors, wherein said controller comprises a first counter having a first input, a second input constituting said third input of said controller, and an output; a decoder having a first input connected to said output of said first counter, a second input, and an output constituting said control output of said controller; a signal detection circuit having a first input connected to said output of said first counter, second and third inputs constituting said second and first inputs of said controller, and an output connected to said first input of said first counter and to said second input of said decoder; and a counter having a first input connected to said output of said signal detection circuit, a second input constituting said control input of said controller and an output constituting said address output of said controller.

* * * * *